(12) United States Patent
Vetter

(10) Patent No.: US 9,335,204 B1
(45) Date of Patent: May 10, 2016

(54) SYSTEM AND METHOD OF ALIGNING A MAGNETIC ELEMENT

(75) Inventor: Arthur M. Vetter, Renton, WA (US)

(73) Assignee: The Boeing Company, Chicago, IL (US)

( * ) Notice: Subject to any disclaimer, the term of this patent is extended or adjusted under 35 U.S.C. 154(b) by 733 days.

(21) Appl. No.: 13/549,846

(22) Filed: Jul. 16, 2012

(51) Int. Cl.
*G01H 13/00* (2006.01)
*G01H 11/00* (2006.01)
*G01H 11/06* (2006.01)

(52) U.S. Cl.
CPC ............. *G01H 13/00* (2013.01); *G01H 11/00* (2013.01); *G01H 11/06* (2013.01)

(58) Field of Classification Search
CPC ....... G01H 11/00; G01H 11/06; G01H 11/08; G01H 13/00
USPC .......................................................... 73/579
See application file for complete search history.

(56) References Cited

U.S. PATENT DOCUMENTS

| | | | | |
|---|---|---|---|---|
| 3,942,369 | A * | 3/1976 | Roggenstein et al. | 73/862.41 |
| 4,418,774 | A * | 12/1983 | Whitney et al. | 177/210 FP |
| 4,845,718 | A | 7/1989 | Pistoresi | |
| 7,046,703 | B2 | 5/2006 | Rice | |
| 7,342,230 | B2 | 3/2008 | Adamski | |
| 2002/0175670 | A1* | 11/2002 | Temnykh et al. | 324/96 |
| 2003/0226441 | A1* | 12/2003 | Barney | 84/297 S |

OTHER PUBLICATIONS

Warren et al., New System for Wiggler Fabrication and Testing, Adriatico Research Conf. on Undulator Magnets for Synchrotron Radiation and Free-Electron Lasers, Trieste, Jun. 23-26, 1987, 13 pgs.
Alexander Temnykh, Vibrating Wire Field-Measuring Technique, 1998, IEEE, pp. 3218-3220.
Fan et al., Pulsed Wire Magnetic Field Measurements on Undulator U10P, 2001, IEEE, pp. 2775-2777.
Stephen M. Wallace, Thesis submitted to Naval Postgraduate School entitled Magnetic Field Measurements of the CEBAF (NIST) Wiggler Using the Pulsed Wire Method, Sep. 1992, 26 pgs.

* cited by examiner

*Primary Examiner* — Laura Martin
*Assistant Examiner* — Rose M Miller
(74) *Attorney, Agent, or Firm* — Womble Carlyle Sandridge & Rice LLP

(57) ABSTRACT

A method is provided that includes transmitting an alternating current along a wire placed along a given axis relative to a magnetic element producing a magnetic field having an axis. The wire may be stretched such that the wire has an audible fundamental frequency. Additionally or alternatively, the alternating current may be a continuous alternating current. The method also includes in at least one instance, detecting a vibration of the wire thereby indicating that a transverse component of the magnetic field is coupled with the alternating current. And in the respective instance(s), the method includes adjusting a position of the wire or magnetic element to at least reduce the vibration of the wire thereby indicating increased alignment of the given axis and magnetic-field axis.

20 Claims, 4 Drawing Sheets

SYSTEM AND METHOD OF ALIGNING A MAGNETIC ELEMENT

TECHNOLOGICAL FIELD

The present disclosure relates generally to determining the magnetic-field axis of a magnetic element and, in particular, to aligning the magnetic-field axis of a magnetic element of a charged-particle beam transport system with a desired axis for the particle beam of the system.

BACKGROUND

Charged-particle beam transport systems often include magnetic elements for partial beam focusing. These systems often require that the magnetic elements be aligned so that the axis of their magnetic field lies on a beam axis of the transport system. Intuitively this may be accomplished by aligning the mechanical axis of the magnetic elements with the beam axis, but it may be the case that the magnetic and mechanical axes of the magnetic element are not aligned. Techniques have therefore been developed for determining the magnetic-field axis of a magnetic element so that it may be aligned with the beam axis in an appropriate charged-particle beam transport system.

A widely used existing technique for determining the magnetic-field axis of a magnetic element involves sending a current pulse along a wire stretched along the putative axis while the magnetic element is energized, and monitoring the wire for any resulting deflection. This method, however, involves the generation of high-voltage pulses, often requires close inspection of the wire and has a limited rate at which observations may be performed. A second technique uses a swept frequency alternating current in the wire, whose motion in numerous (on the order of 30) harmonic vibrational modes may be detected using a phototransistor. The spatial distribution of the transverse magnetic field may then be reconstructed numerically using the data from the harmonics. This second technique, however, requires many minutes to make the required frequency scans.

Therefore, it may be desirable to have a system and associated method of determining the magnetic-field axis of a magnetic element that takes into account at least some of the issues discussed above, as well as possibly other issues.

BRIEF SUMMARY

Example embodiments of the present disclosure are generally directed to an improved system and associated method of determining the magnetic-field axis of a magnetic element, such as for alignment of the magnetic-field axis with a desired beam axis in a charged-particle beam transport system including the magnetic element. According to one aspect of example embodiments, a method is provided that includes transmitting an alternating current along a wire placed along a given axis relative to a magnetic element producing a magnetic field having an axis. The wire may be stretched such that the wire has an audible fundamental frequency. The alternating current, then, may be transmitted at a frequency substantially equal to the fundamental resonant frequency of the wire. In one example, the alternating current may be a continuous alternating current.

The method also includes in at least one instance, detecting a vibration of the wire thereby indicating that a transverse component of the magnetic field is coupled with the alternating current. In one example, the amplitude of the vibration may be detected using a transducer. In one example, detecting the vibration may include adjustment of a sensitivity of the wire to vibration using an adjustable damper. And the method includes adjusting a position of the wire or magnetic element to at least reduce the vibration of the wire thereby indicating increased alignment of the given axis and magnetic-field axis.

In one example, detecting the vibration of the wire includes detecting vertical and horizontal components of the vibration of the wire using independent, orthogonal transducers. In this example, the position may be adjusted vertically and horizontally to reduce respective ones of the vertical and horizontal components. Further to this example, the method may include separately amplifying the vertical and horizontal components of the vibration of the wire, and receiving the amplified vertical and horizontal components at respective audio output devices. The vertical and horizontal components may then be binaurally monitored using the audio output devices to determine any misalignment in the vertical or horizontal direction.

In one example, the magnetic element may be of a charged-particle beam transport system, and the given axis may correspond to a desired axis for a particle beam of the charged-particle beam transport system. In this example, the position of the magnetic element may be adjusted in lieu of the wire. Also in this example, the charged-particle beam transport system may include a plurality of magnetic elements each of which produces a magnetic field having an axis. The alternating current may therefore be transmitted, vibration detected and position adjusted for each of the magnetic elements.

The features, functions and advantages discussed herein may be achieved independently in various example embodiments or may be combined in yet other example embodiments further details of which may be seen with reference to the following description and drawings.

BRIEF DESCRIPTION OF THE DRAWING(S)

Having thus described example embodiments of the disclosure in general terms, reference will now be made to the accompanying drawings, which are not necessarily drawn to scale, and wherein:

DETAILED DESCRIPTION

Figure 1:
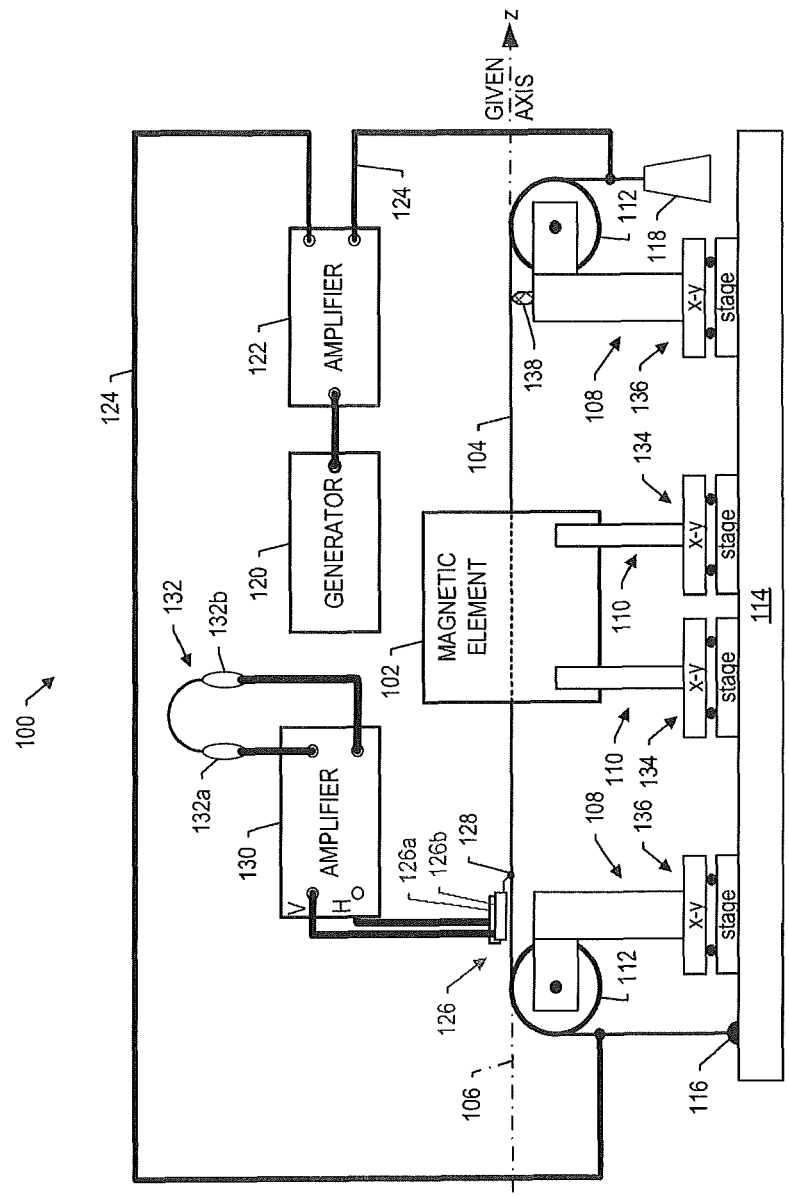
FIG. 1 illustrates a system according to one example embodiment.

Some embodiments of the present disclosure will now be described more fully hereinafter with reference to the accompanying drawings, in which some, but not all embodiments of the disclosure are shown. Indeed, various embodiments of the disclosure may be embodied in many different forms and should not be construed as limited to the embodiments set forth herein; rather, these example embodiments are provided so that this disclosure will be thorough and complete, and will fully convey the scope of the disclosure to those skilled in the art. Like reference numerals refer to like elements throughout.

Example embodiments of the present disclosure are generally directed to an improved system and associated method of determining the magnetic-field axis of a magnetic element, such as by alignment of the magnetic-field axis with a given or desired axis. Example embodiments may be particularly suited for alignment of beamline magnetic elements (or rather their magnetic axes) with the beam axis in a charged-particle beam transport system. It should be understood, however, that example embodiments may have application in other applications not involving a charged-particle beam transport system or a beamline magnetic element of such a system.

In various examples, the magnetic element may be part of a charged-particle beam transport system, and the desired axis may be for a particle beam of the charged-particle beam transport system. Examples of suitable charged-particle beam transport systems include a particle accelerator, free-electron laser (FEL) system or the like. Examples of suitable magnetic elements include one or more dipoles, quadrupoles, sextapoles or the like in any number of different configurations or arrangements such as in a FODO array, singlet, doublet, triplet, DQQQD system or the like, one or more axial field coils or the like. Suitable magnetic elements may therefore include either or both of a permanent magnetic element or an electromagnetic element.

FIG. 1 illustrates a system 100 for determining the magnetic-field axis of a magnetic element 102 according to one example embodiment. As shown, the system includes a number of components coupled and configured to communicate with one another. It should be understood that unless otherwise stated, components may be coupled and configured to communicate with one another by wire, cable, lead or the like, or wirelessly, as appropriate.

As shown, the system 100 may include a wire 104 placed along a given axis 106 relative to the magnetic element producing a magnetic field having an axis. In one example, the magnetic element may be placed such that its mechanical axis lies along the given axis. As indicated above, in one example, the magnetic element may be of a charged-particle beam transport system, and the given axis may correspond to a desired axis for a particle beam of the charged-particle beam transport system. The magnetic element may be of any of a number of different types as indicated above. In one example, the magnetic element may include a permanent magnet element. In another example, the magnetic element may include an electromagnetic element, and in this other example, the system may include a current source configured to energize the electromagnetic element to produce the magnetic field.

The system 100 may include supports 108 configured to hold the wire 104, and may include supports 110 configured to hold the magnetic element 102. The wire supports may be configured to hold the wire stretched with a tension such that the wire has a selectable fundamental resonant frequency. In one example, the supports may be configured to hold the wire stretched with a tension such that the wire has an audible fundamental resonant frequency (e.g., 20 to 20,000 Hz). This may permit the wire to resonate in its fundamental resonant mode at an audible frequency much as the string of a stringed musical instrument would. The wire supports may hold the wire in a number of different manners. As shown, for example, the wire supports may include respective dielectric pulleys 112 across which the wire may be drawn. At one end the wire may be secured to a base 114 by an appropriate mechanical attachment 116, and at the other end the wire may be attached to a tensioning weight 118.

The system 100 may include a generator 120 configured to transmit an alternating current such as a continuous alternating current along the wire 104. In one example, the generator may be configured to transmit the alternating current at a frequency substantially equal to the fundamental resonant frequency of the wire, which as indicated above, may be an audible fundamental. The generator may be of any of a number of suitable types. For example, the generator may be an oscillator such as an audio oscillator, which in one example may be coupled to an amplifier 122 such as an audio amplifier configured to amplify the alternating current. The amplifier may be coupled to both ends of the wire by respective low-impedance output leads 124 electrically connected to the wire to effect transmission of the alternating current along the wire.

Figure 2A:
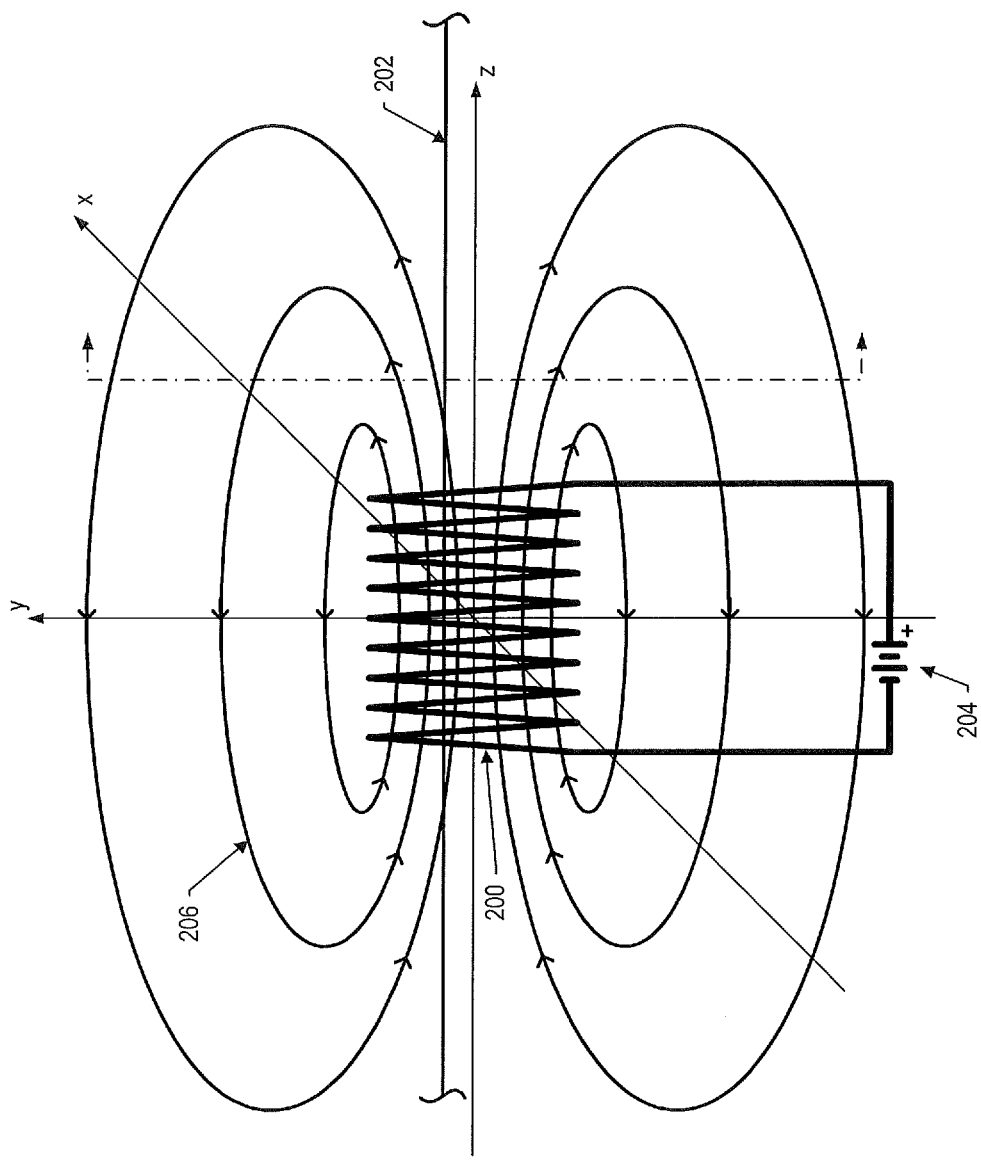
FIGS. 2a and 2b (collectively "FIG. 2") are a side view and corresponding cross-section illustrating a principle by which misalignment of a magnetic-field axis and wire may be determined according to one example embodiment.
Figure 2B:
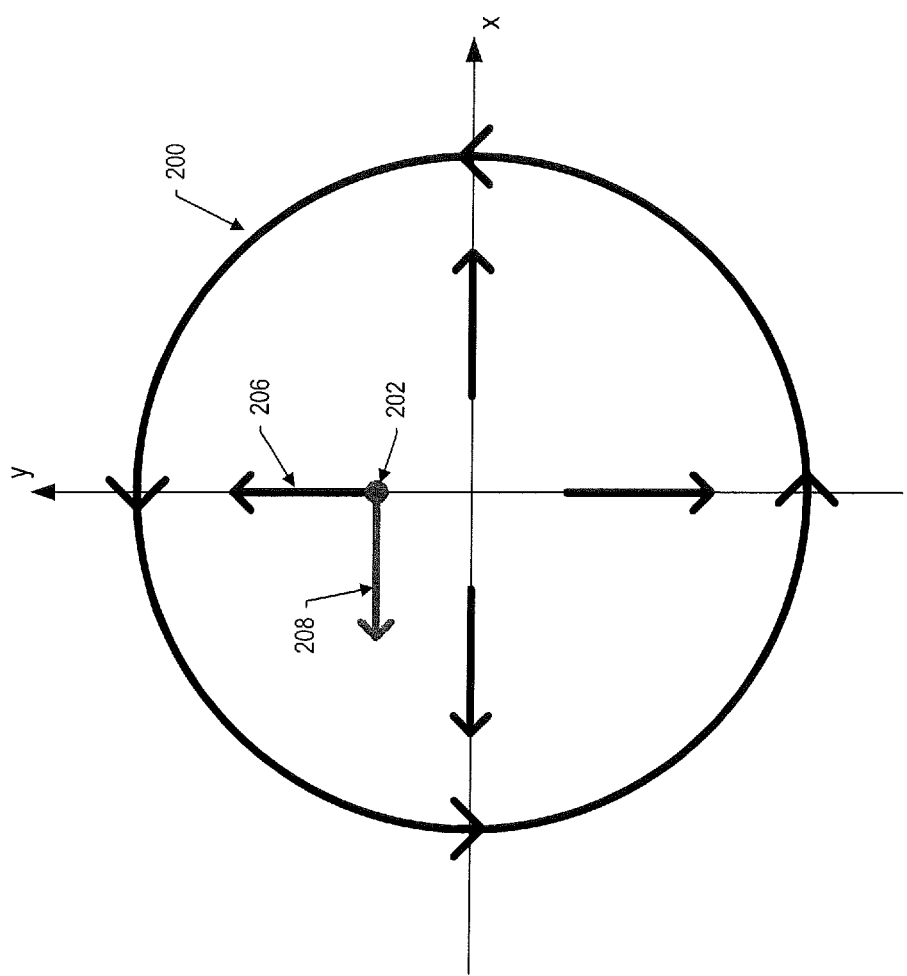

In an instance in which the magnetic-field axis of the magnetic element 102 and wire 104 are misaligned, the transverse component of magnetic field produced by the magnetic element may couple with the alternating current in the wire to produce an alternating transverse force on the wire at its resonant frequency, which may result in vibration of the wire. FIGS. 2a and 2b (collectively "FIG. 2") present a side view and corresponding cross-section to illustrate this principle in the context of a solenoid coil 200 through which a wire 202 may be placed, which solenoid coil and wire in one example may correspond to the magnetic element 102 and wire 104 of FIG. 1. As shown, the solenoid coil may be energized by an appropriate current source 204 to produce lines of magnetic induction 206. As shown more particularly in FIG. 2b in an instance in which the magnetic-field axis and wire are misaligned, an alternating transverse force 208 may be produced on the wire that may result in its vibration.

Returning to FIG. 1, the system may therefore also include a transducer 126 configured to detect a vibration of the wire 104 such as an amplitude of the vibration thereby indicating that a transverse component of the magnetic field is coupled with the alternating current. More particularly, for example, the transducer may include independent, orthogonal transducers 126a, 126b (or orthogonal sets of transducers) configured to detect vertical and horizontal components of the vibration of the wire. The transducers may be of any of a number of suitable types for detecting vibration. In one example, the transducer may include a pickup such as a ceramic stereo phono pickup, magnetic pickup coil or the like, and may include a stylus or needle 128 adhered to or otherwise in contact with the wire.

As described herein, the terms "horizontal" and "vertical" merely refer to directions orthogonal to one another, and orthogonal to the given axis 106. Thus, in one example including x, y and z axes in which the given axis lies along the z axis, horizontal and vertical may refer to directions lying along the x and y axes, or conversely may refer to directions lying along the y and x axes.

The system may further include an amplifier 130 such as a stereo amplifier configured amplify the vibration of the wire 104, and output the amplified vibration to an appropriate detection device 132 to enable an operator to monitor the vibration to determine any misalignment of the magnetic-field axis of the magnetic element 102 and wire. In one example, the detection device may include an audio output device such as stereo headphones. In other example, the detection device may include a synchronous detection device such as a lock-in amplifier, which may in some instances provide greater sensitivity than an audio output device.

In a more particular example, the amplifier may be configured to separately amplify the vertical (V) and horizontal (H) components of the vibration of the wire, which in the context of a stereo amplifier may be carried by left (L) and right (R) channels. In this example, the detection device may include two devices 132a, 132b configured to receive respective ones of the amplified vertical and horizontal components from the amplifier to enable an operator to monitor (binaurally in the context of audio output devices) the vertical and horizontal components to determine any misalignment of the magnetic-field axis and wire in the vertical or horizontal direction.

The system 100 may further include a stage configured to adjust a position of the magnetic element 102 or wire 104 to at least reduce the vibration of the wire thereby indicating increased alignment of the given axis 106 and magnetic-field axis of the magnetic element. The system may include a stage to adjust the position of the magnetic element, and/or a stage to adjust the position of the wire. In one example, the system may include one or more stages 134 coupled to respective ones of the magnetic-element supports 110 to adjust the position of the magnetic element, and/or one or more stages 136 coupled to respective ones of the wire supports 108 to adjust the position of the wire.

In a more particular example, the stage 134, 136 of either or both the magnetic element 102 or wire 104 may be configured to adjust the position of the magnetic element or wire vertically and horizontally to reduce respective ones of vertical and horizontal components of the vibration of the wire. In one example, the stage of the wire may include an adjustable damper 138 configured to adjust a sensitivity of the wire to vibration. In other examples, sensitivities in the system may be adjusted by adjusting the amplitude of the alternating current output by the generator 122, and/or gains of either or both amplifiers 122, 130.

In the example in which the magnetic element 102 is of a charged-particle beam transport system, it may be more practical in some instances to adjust the position of the magnetic element instead of the position of the wire 104 placed along the given axis 106 corresponding to the desired axis for the particle beam of the charged-particle beam transport system. Also in this example, the charged-particle beam transport system may include a plurality of magnetic elements each of which produces a magnetic field having an axis. In these instances, the alternating current may be transmitted, vibration detected and position adjusted for each of the magnetic elements.

Figure 3:
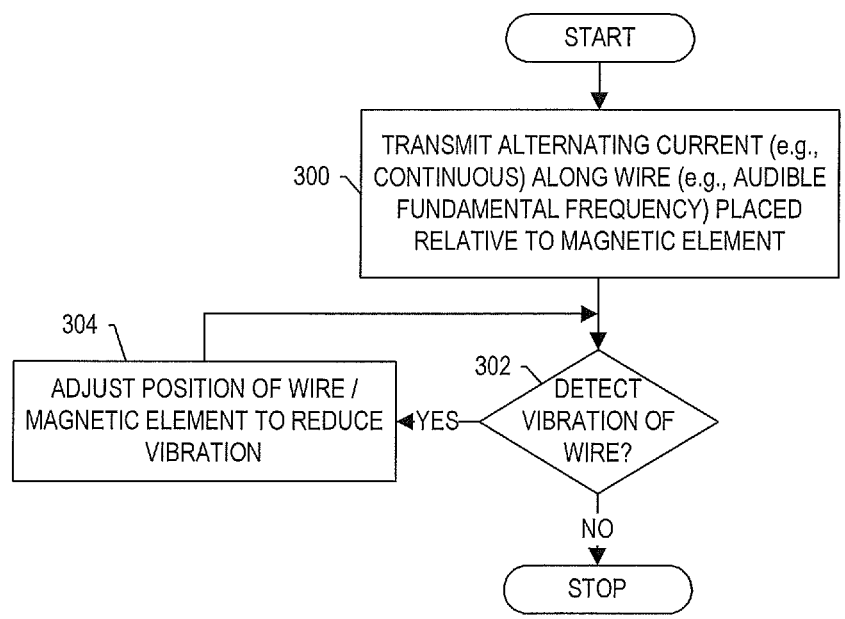
FIG. 3 is a flowchart illustrating various steps in a method according to one example embodiment.

Reference is now made to FIG. 3, which illustrates various steps in a method according to example embodiments of the present disclosure. As shown in block 300, the method may include the generator 120 transmitting an alternating current along the wire 104 placed along the given axis 106 relative to the magnetic element 102 producing a magnetic field having an axis. The wire may be stretched such that the wire has an audible fundamental frequency. The alternating current, then, may be transmitted at a frequency substantially equal to the fundamental resonant frequency of the wire. In one example, the alternating current may be a continuous alternating current.

The method also includes in at least one instance, detecting vibration of the wire 104 thereby indicating that a transverse component of the magnetic field is coupled with the alternating current, as shown in block 302. In one example, the amplitude of the vibration may be detected using the transducer 126. In one example, detecting the vibration may include adjustment of a sensitivity of the wire to vibration using the adjustable damper 138. As shown in block 304, the method may include adjusting the position of the wire or magnetic element 102 to at least reduce the vibration of the wire thereby indicating increased alignment of the given axis and magnetic-field axis. This may be accomplished using stages 134, 136, and may continue such as until the vibration of the wire stops or is otherwise no longer detected.

In one example, the transducer 126 may include independent, orthogonal transducers 126a, 126b for detecting vertical and horizontal components of the vibration of the wire 104. In this example, the position may be adjusted vertically and horizontally to reduce respective ones of the vertical and horizontal components. Further to this example, the method may include an amplifier 130 separately amplifying the vertical and horizontal components of the vibration of the wire, and respective audio output devices 132a, 132b receiving the amplified vertical and horizontal components. The vertical and horizontal components may then be binaurally monitored using the audio output devices to determine any misalignment in the vertical or horizontal direction.

In one example, the magnetic element 102 may be of a charged-particle beam transport system, and the given axis 106 may correspond to a desired axis for a particle beam of the charged-particle beam transport system. In this example, the position of the magnetic element may be adjusted in lieu of the wire 104. Also in this example, the charged-particle beam transport system may include a plurality of magnetic elements each of which produces a magnetic field having an axis. The alternating current may therefore be transmitted, vibration detected and position adjusted for each of the magnetic elements.

To more fully understand one context in which example embodiments may be practiced, consider an example in which the wire 104 has an audible fundamental resonant frequency, and the wire transmits an alternating current at this frequency, and in which the system 100 includes suitable audio components such as those identified above. In operation, an operator may monitor an amplified signal from the pickups (transducer 126) on the headphones 132 and determine any misalignment between the magnetic-field axis of the magnetic element 102 and wire 104 by hearing a detected response. Even more particularly, the operator may determine misalignment in the vertical or horizontal direction by the headphone in which the operator hears the detected response. The observation may be continuous and perceived through audio channels, which may allow the user to audibly monitor improvement in alignment in real time while directing visual attention to adjusting the appropriate supports 134, 136 to minimize the response perceived through the headphones. This may reduce the time required to determine the magnetic-field axis of the magnetic element 102 through its alignment with the wire.

Many modifications and other embodiments of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:
1. A system comprising:
    a generator configured to transmit a continuous alternating current along a wire placed along a given axis relative to a magnetic element producing a magnetic field having an axis;

a transducer configured to detect a vibration of the wire in at least one instance, thereby indicating that a transverse component of the magnetic field is coupled with the alternating current; and a stage configured to adjust a position of the wire or magnetic element to at least reduce the vibration of the wire thereby indicating increased alignment of the given axis and magnetic-field axis.

2. The system of claim 1 further comprising supports configured to hold the wire stretched such that the wire has an audible fundamental resonant frequency.

3. The system of claim 1, wherein the generator is configured to transmit the alternating current at a frequency substantially equal to the fundamental resonant frequency of the wire.

4. The system of claim 1, wherein the transducer comprises independent, orthogonal transducers configured to detect vertical and horizontal components of the vibration of the wire, and wherein the stage is configured to adjust the position vertically and horizontally to reduce respective ones of the vertical and horizontal components.

5. The system of claim 1, wherein the magnetic element is of a charged-particle beam transport system, and the given axis corresponds to a desired axis for a particle beam of the charged-particle beam transport system, and wherein the stage is configured to adjust the position of the magnetic element.

6. A system comprising:

a generator configured to transmit an alternating current along a wire placed along a given axis relative to a magnetic element producing a magnetic field having an axis, the wire being stretched such that the wire has an audible fundamental frequency;

a transducer configured to detect a vibration of the wire in at least one instance, thereby indicating that a transverse component of the magnetic field is coupled with the alternating current; and a stage configured to adjust a position of the wire or magnetic element to at least reduce the vibration of the wire thereby indicating increased alignment of the given axis and magnetic-field axis.

7. The system of claim 6, wherein the generator is configured to transmit the alternating current at a frequency substantially equal to the fundamental resonant frequency of the wire.

8. The system of claim 6, wherein the transducer comprises independent, orthogonal transducers configured to detect vertical and horizontal components of the vibration of the wire, and wherein the stage is configured to adjust the position vertically and horizontally to reduce respective ones of the vertical and horizontal components.

9. The system of claim 8 further comprising:

an amplifier configured to separately amplify the vertical and horizontal components of the vibration of the wire;

audio output devices configured to receive respective ones of the amplified vertical and horizontal components, the audio output devices enabling an operator to binaurally monitor the vertical and horizontal components to determine any misalignment in the vertical or horizontal direction.

10. The system of claim 6, wherein the magnetic element is of a charged-particle beam transport system, and the given axis corresponds to a desired axis for a particle beam of the charged-particle beam transport system, and wherein the stage is configured to adjust the position of the magnetic element.

11. A method comprising:

transmitting a continuous alternating current along a wire placed along a given axis relative to a magnetic element producing a magnetic field having an axis; and in at least one instance, detecting a vibration of the wire thereby indicating that a transverse component of the magnetic field is coupled with the alternating current; and adjusting a position of the wire or magnetic element to at least reduce the vibration of the wire thereby indicating increased alignment of the given axis and magnetic-field axis.

12. The method of claim 11 further comprising placing the wire along the given axis, including stretching the wire such that the wire has an audible fundamental resonant frequency.

13. The method of claim 11, wherein the alternating current is transmitted at a frequency substantially equal to the fundamental resonant frequency of the wire.

14. The method of claim 11, wherein detecting the vibration of the wire includes detecting vertical and horizontal components of the vibration of the wire using independent, orthogonal transducers, and adjusting the position includes adjusting the position vertically and horizontally to reduce respective ones of the vertical and horizontal components.

15. The method of claim 11, wherein the magnetic element is of a charged-particle beam transport system, and the given axis corresponds to a desired axis for a particle beam of the charged-particle beam transport system, and wherein adjusting the position of the wire or magnetic element comprises adjusting the position of the magnetic element.

16. A method comprising:

transmitting an alternating current along a wire placed along a given axis relative to a magnetic element producing a magnetic field having an axis, the wire being stretched such that the wire has an audible fundamental frequency; and in at least one instance, detecting a vibration of the wire thereby indicating that a transverse component of the magnetic field is coupled with the alternating current; and adjusting a position of the wire or magnetic element to at least reduce the vibration of the wire thereby indicating increased alignment of the given axis and magnetic-field axis.

17. The method of claim 16, wherein the alternating current is transmitted at a frequency substantially equal to the fundamental resonant frequency of the wire.

18. The method of claim 16, wherein detecting the vibration of the wire includes detecting vertical and horizontal components of the vibration of the wire using independent, orthogonal transducers, and adjusting the position includes adjusting the position vertically and horizontally to reduce respective ones of the vertical and horizontal components.

19. The method of claim 18 further comprising:

separately amplifying the vertical and horizontal components of the vibration of the wire;

receiving the amplified vertical and horizontal components at respective audio output devices; and binaurally monitoring the vertical and horizontal components using the audio output devices to determine any misalignment in the vertical or horizontal direction.

20. The method of claim 16, wherein the magnetic element is of a charged-particle beam transport system, and the given axis corresponds to a desired axis for a particle beam of the charged-particle beam transport system, and wherein adjusting the position of the wire or magnetic element comprises adjusting the position of the magnetic element.

* * * * *